US006450091B1

United States Patent
Bourrieres et al.

(10) Patent No.: US 6,450,091 B1
(45) Date of Patent: Sep. 17, 2002

(54) MINI-STENCIL AND DEVICE FOR USING SAME

(75) Inventors: Francis Bourrieres; Clement Kaiser, both of Mountauban (FR)

(73) Assignee: Societe Novatec S.A., Mountrauban (FR)

( * ) Notice: Subject to any disclaimer, the term of this patent is extended or adjusted under 35 U.S.C. 154(b) by 0 days.

(21) Appl. No.: 09/508,341

(22) PCT Filed: Sep. 14, 1998

(86) PCT No.: PCT/FR98/01957
§ 371 (c)(1),
(2), (4) Date: Mar. 10, 2000

(87) PCT Pub. No.: WO99/14049
PCT Pub. Date: Mar. 25, 1999

(30) Foreign Application Priority Data

| Sep. 16, 1997 | (FR) | 97 11507 |
| Dec. 3, 1997 | (FR) | 97 15415 |
| May 7, 1998 | (FR) | 98 05777 |

(51) Int. Cl.[7] .......................... B41L 13/02; B41F 15/34
(52) U.S. Cl. ................ 101/127.1; 101/114; 101/128.4; 118/213; 118/406
(58) Field of Search ................ 101/112, 114, 101/123, 124, 126, 127, 127.1, 128, 128.1, 128.4, 129; 118/213, 406

(56) References Cited

U.S. PATENT DOCUMENTS

| 4,336,754 A | * | 6/1982 | Loeb | 101/127 |
| 4,745,857 A | | 5/1988 | Putnam et al. | 101/44 |
| 5,107,759 A | | 4/1992 | Omori et al. | 101/114 |
| 5,119,724 A | | 6/1992 | Ng | 101/41 |
| 5,123,345 A | | 6/1992 | Wood | 101/123 |
| 5,613,436 A | | 3/1997 | Taylor | 101/115 |
| 5,704,287 A | | 1/1998 | Omori et al. | 101/127.1 |
| 5,755,157 A | | 5/1998 | Omori et al. | 101/114 |
| 6,158,339 A | * | 12/2000 | Blazek et al. | 101/127.1 |
| 6,253,675 B1 | * | 7/2001 | Mayer | 101/127.1 |

FOREIGN PATENT DOCUMENTS

| DE | 3522500 | 1/1987 |
| DE | 35 35863 | 4/1987 |
| DE | 4239995 | 1/1994 |
| FR | 94 08518 | 1/1996 |

* cited by examiner

Primary Examiner—Leslie J. Evanisko
(74) Attorney, Agent, or Firm—Vidas, Arrett &Steinkraus P.A.

(57) ABSTRACT

A stencil (8) with a tension part combined with an operational device allowing deposition of solder paste to replace constituents on an electronic board. The stencil consists of a flat sheet (1), of rectangular shape, made of synthetic flexible material or metal and outfitted with transfer openings (2) for transferring and distributing a product. Two of the parallel sides of the sheet are connected to rigid and mobile vertical tabs (3) in an affixed position on a tension unit of the sheet. The other two parallel sides of the sheet, orthogonal to the former ones, are extended with flexible walls (6), orthogonal to the sheet. Bead folds (7) separate the perforated sheet and each of the flaps and delimit the sheet. The flaps freely rotate around the folds. The invention also has an operational device consisting of arm (20) with several jointed strands outfitted with a sole means of locking (22) its joints. The stencil may be configured and moved in accordance with 6 degrees of freedom.

15 Claims, 4 Drawing Sheets

MINI-STENCIL AND DEVICE FOR USING SAME

FIELD OF THE INVENTION

The instant invention concerns a ministencil for repairing and/or replacing a unit and/or group of constituents on an electronic board and its operational system. The said stencil allows to deposit solder paste, flux or conductive adhesive.

BACKGROUND OF THE INVENTION

It may be found necessary, during manufacturing, after a check or when manufacturing has been completed, to replace a defective constituent or to add one or several missing constituents.

In this case, it is necessary to deposit flux and/or solder paste onto the acceptance areas of the constituents in question.

Depending on the board configuration and layout of the various constituents, access to the acceptance areas in question is not always simple.

The known technique is to use metal micro-stencils either with a central support, or a lateral one on two or three sides.

These metal micro-stencils present several drawbacks. With this kind of stencil it is not possible to come closer than 2 millimeters from another constituent located in the immediate vicinity of the acceptance areas to be treated; even when this is feasible, it is impossible to avoid an overflow of solder paste from the mini-stencil when using a mini-scraper during a screen printing operation.

These micro-stencils use the rigidity of the metal, because they cannot be strained. The tension being nil, these stencils are only very rarely perfectly in contact with the surface of the board, and screen printing is, therefore, imperfect.

To have adequate rigidity with the metal stencil a minimum thickness of the stencil is required. This required thickness or minimal thickness poses a problem for fine step screen printing, the size of the smallest acceptable opening being one and a half times the thickness so as to lift the plugs. Indeed, with the known metal stencils used for this operation, it is difficult to attain a pitch of 0.635 mm.

SUMMARY OF THE INVENTION

The stencil in accordance with the invention allows to make the rigidity of the stencil independent of its thickness, allowing to use a pitch thickness of 0.4 mm.

The rigidity required of the metal micro-stencil to obtain adequate stability of the stencil does not allow to model it so as to have it in perfect contact with the circuits to be repaired or completed. Moreover, given that the circuits are already equipped with constituents of various shapes and dimensions, it is necessary to conduct positioning mountings of the circuits on the support table to obtain the stencil and circuit to be parallel.

Unless this is done, a fastidious task, the screen printing is imperfect, i.e. completely defective. Moreover, visual positioning of metal micro-stencils on the acceptance areas which can be undertaken only by way of pinpointing through its opening is particularly time-consuming.

The instant invention aims at overcoming these drawbacks by producing, on the one hand, a stencil combined with a rigidity system independent of its thickness, allowing to deposit flux and/or solder paste, and/or conductive adhesive on acceptance areas of a constituent or group of constituents without the product overflowing outside the stencil, the positioning of the latter being, moreover, simplified by means of its design, and, on the other hand, to combine the stencil with a device for operating the said stencil allowing to position the stencil rapidly and in perfect contact with the board, regardless of the medium of the acceptance areas in question or the composition of the board, any type of constituent being accessible to the stencil in accordance with the invention. The stencil in accordance with the invention is flexible and can be moved in space in accordance with 6 degrees of freedom. Therefore, the stencil meets all of the objectives for which it is designed.

To this effect, the stencil in accordance with the invention allows to deposit solder paste, flux or conductive adhesives on acceptance areas for distributing and/or replacing constituents on an electronic board, is generally characterized by the fact that it comprises:

a flat sheet, of rectangular shape, made of synthetic flexible material or metal, outfitted with transfer openings for distributing a product at a constant amount corresponding to the acceptance areas and the tabs of the constituents;

two of the sides parallel to the sheet are connected to perpendicular tabs to the sheet, rigid and mobile in the position of gripping the sheet onto a support and subjecting the sheet to tension.

the two other parallel sides of the sheet are extended with flexible flaps, a stiffening and jointed fold separating the perforated sheet and each of the flexible flaps, the said fold delimiting the sheet, the flaps freely rotating around the said fold.

In accordance with another characteristic of the invention, the stencil forms an enclosure with a flexible bottom with openings, and opened toward the top, and accessible from the top or two of its sides, or at least one of them.

In accordance with another characteristic, the sheet is semi-transparent or translucent.

In accordance with yet another characteristic of the invention, the flexible flaps orthogonal to the sheet are free with regard to the other sides of the sheet connected to the affixing tabs.

In accordance with yet another characteristic of the invention, the tension unit for putting the stencil under tension, to which, in accordance with the invention, the stencil is affixed by a wing parallel to the sheet of each of the rigid tabs perpendicular to the sheet includes:

a stencil tension axle by spreading or contracting the tabs parallel to the sheet, a displacement control axle of the stencil support devices, parallel to the sheet for stretching the stencil;

a rotation axle for each tab parallel to the sheet;

a rotation axle for each tab perpendicular to the sheet; allowing to always position and shape the stencil locally as a function of the position of the board, so that it is closely applied to the latter under tension, even when the board is warped. One operational element formed by an articulating arm allows the stencil to reach any position in space.

DESCRIPTION OF THE DRAWINGS

Other advantages and characteristics of the invention shall appear upon reading the description of a preferential operational shape of the invention with the attached diagrams, provided as examples, but not limited to them, in which.

DETAILED DESCRIPTION OF THE INVENTION

Figure 1:
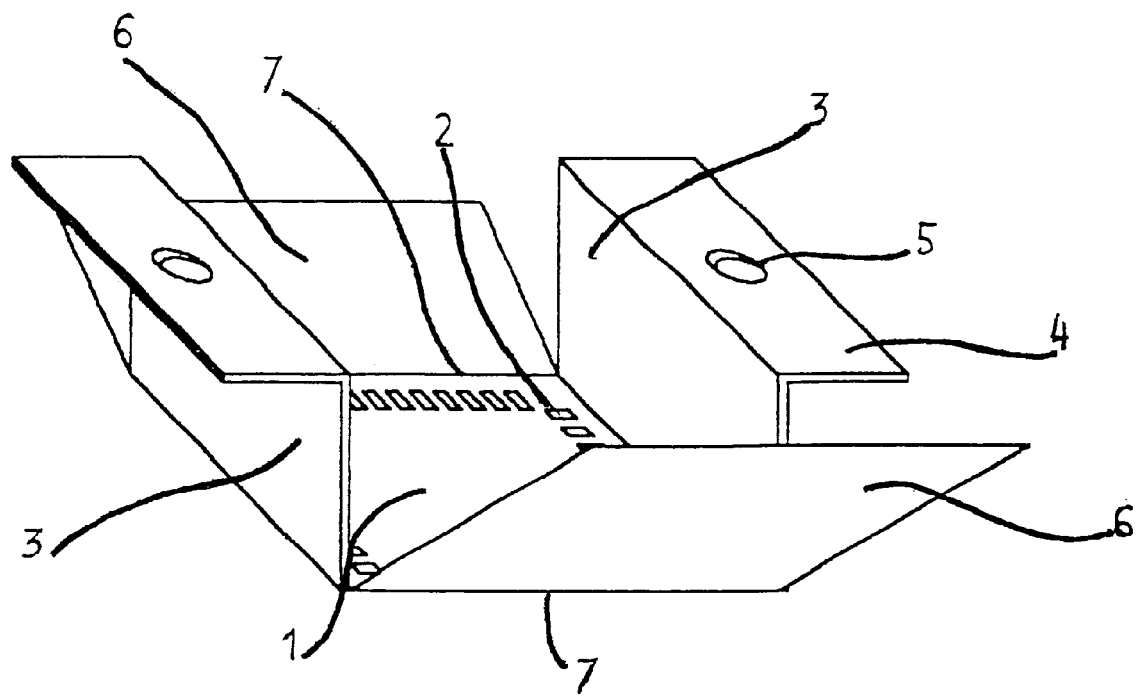
FIG. 1 shows a perspective view of a stencil unit in accordance with the invention.

As shown in FIG. 1, the stencil in accordance with the invention consists of a flat sheet 1, of rectangular shape, made of synthetic flexible material or metal, outfitted with transfer openings 2 for distributing a product. An advantage is that the dimensions of the sheet and the position of the openings correspond to a type of constituent, openings 2 correspond to the position and the shape of the acceptance areas of the said constituent. The need may arise to treat simultaneously a group of identical or different constituents located next to each other; in this case, the dimensions of the stencil will be adapted to the overall treatment.

The purpose of French Patent No. 94.08518 by the same inventor, was the feeding of the product such that the deposited blocks vary in height with a stencil of a same thickness. To accomplish this, it was required to have circular openings of different diameters, varying from each other based on the height chosen for the blocks. In this application, each opening behaves as a reservoir which drains out more or less. In the case of the instant stencil, subject of the filing and patent arising there from, the openings are not necessarily circular, but in all cases they are identical to each other for a same constituent, and in all cases the stencil is designed so that each opening drains out completely and not partially.

Sheet 1 is a flexible sheet with sufficient mechanical resistance to come under tension and resistance to chemical agents. A material such as polyester is particularly suitable for this use. In certain cases, using a metal sheet may also prove to be appropriate.

In the instant invention, the material used may be the same as that of patent No. 94.08518, however for different reasons.

Patent 94.08518 makes use of stretching characteristics to obtain off-contact ahead of, and behind the scraper. In the instant invention off-contact is not desired, in fact it is eliminated. It is the flexibility of the material which is used to obtain a close contact between the surface of the stencil and the board or the circuit itself, even when the surface of the former one is warped. In fact, it is desired to adapt the stencil to the substrate. To achieve this, the flexibility of the sheet is combined, as described below, with the rotation axles of the tension unit.

Two of the parallel sides of the sheet are connected or affixed to rigid tabs 3. Each tab has a portion perpendicular to the sheet whose width is equal to the dimension of the side of the sheet, and a wing 4 perpendicular to the former one with a median perforation 5 for affixing to the tension unit. Tabs 3 act as stretchers of the sheet and allow it to be subject to tension.

The height of the tabs varies from one stencil to another depending on the adjoining constituents. The tab height may vary for a same stencil and be adjusted at will depending on the height of the adjoining constituents.

The other two sides of the sheet are each extended with a flexible flap 6, a bead fold 7 separating sheet 1 and each of the flaps and delimiting the sheet, flaps 6 freely rotating around bead folds 7.

These layouts generate a stencil forming an enclosure consisting of a flexible bottom with openings 2, opened toward the top, and accessible from the top or two of its sides, or at least one of them if one of the two flaps is free. This layout of the invention allows to stiffen the sheet in the area not held by the tabs as well as avoid spreading the cream beyond the latter.

This layout of the invention allows to use a scraper whose length is that of the stencil, which allows to complete the screen printing in a single sweep of the scraper. Use of a scraper whose length corresponds to that of the stencil allows to obtain the cream to rotate on the stencil, and which, by using the thixotropic capacities of the cream, allows to homogenize the cream while avoiding to disarrange its structure by way of shears or oxidation, and to liquefy it. On the existing micro-stencils, namely those with a central affixing, it is necessary to sweep in several strokes. This generates irregular deposits, especially if the stencil is not closely applied to the substrate. With the instant invention it is possible to sweep the surface of the circuit (the substrate) corresponding to the constituent with a single sweep given that there is no obstacle in the direction of the scraper and moreover, that the flexible vertical walls 6 or flaps stop the product at the beginning and end of the sweep.

The device for operating the stencil in accordance with the invention allows to move the latter with wide range movements in space in accordance with six degrees of freedom. It is, therefore, possible with the invention to accede and screen print substrates in any stable condition in space; this holds the following advantages:

- positioning of the substrate is no longer necessary,
- it becomes possible to easily make screen printing on boards equipped with other constituents,
- it becomes possible to easily make screen printing on boards which are contained in a casing or on a three-dimensional unit. The invention is especially adapted to selective screen printing.

Screen printing is called selective when a circuit needs repairing or a constituent needs replacing. In this case micro-stencils are used. However, it goes without sayings that the invention is not limited to this case, but applies more generally to cases in which screen printing is to be made on hard to access areas of a substrate.

The problem in using micro-stencils is that they need to closely adapt to the configuration of the substrate in the area subject to selective screen printing.

This configuration is difficult to obtain with metal micro-stencils of the former art of printing. These stencils are affixed on a vertical median support axle or moved out of center at their surface, which renders screen printing difficult and does not always allow to plate them closely to the substrate, and does not allow to obtain satisfactory screen printing: imperfect or improperly placed blocks, impossibility of making fine steps, etc.

The instant invention allows to move the stencil in all positions in space while making it conform to the substrate, search just once for the ideal position of the stencil in space, in accordance with the six degrees of freedom, by way of a close contact between the stencil and the substrate, and, furthermore, to find the ideal position when another screen printing operation is required on a same substrate.

To this effect, the device in accordance with the invention for producing screen printing in determined and delimited areas on a substrate, and this whether the position of the latter is stable or stabilized, or the configuration of all dimensions in the medium of the area, or areas, of the substrate on which the screen printing is to be executed, the stencil being stretched on a support, essentially characterized by the fact that the stencil and its stretcher are affixed on a part allowing for their free movement such that the stencil can be moved and plated onto the electronic board at the area where the screen printing is to be executed, and this, regardless of the position and shape of the electronic board in question, in that the position of the part can be locked, such that the stencil and its tension unit are locked in a position to create the screen printing, and that they may be moved away from the substrate for its evacuation and/or replacement, and relocate the screen printing position by moving in the reverse direction, the distancing or approach of the stencil being executed orthogonally, or close thereto, with regard to the electronic board.

In accordance with a layout of the invention, the operation part is an arm with several rods with joints, with the ability of locking one or several of its joints, the said arm bearing at one of its extremities a tension unit on which the stencil is stretched, and its other extremity being affixed.

In accordance with another layout of the invention, the operational unit is a gate.

The operational unit allows the stencil, in accordance with the invention, to move in space. Other advantages and characteristics of the invention shall appear upon reading the description below of a manner for executing the invention, provided as an example, but not limited thereto, and shown in the attached drawings, in which FIGS. 3 and 4 show two manners for operating the stencil in accordance with the invention.

In accordance with the invention, the process for executing screen printing in determined and delimited areas of a substrate, regardless of the position of the electronic board, uses stencil 8, which could be a micro-stencil, whose dimensions must, in all cases, be adapted to the screen printing to be executed.

Figure 3:
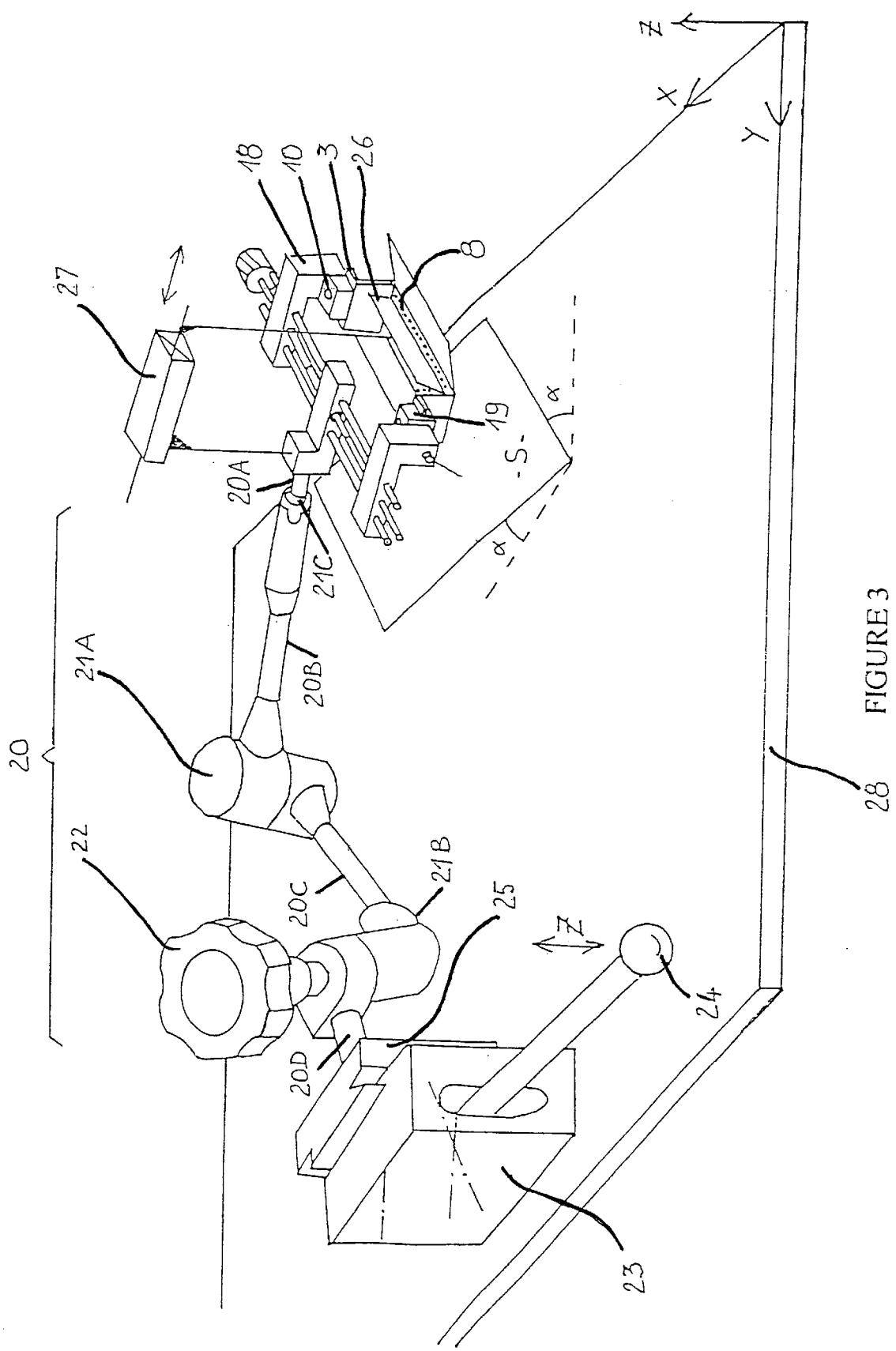
FIG. 3 shows a manner for working a device forming a jointed arm for operating the stencil in any area in space, wherein the set can move in accordance with 6 degrees of freedom.
Figure 4:
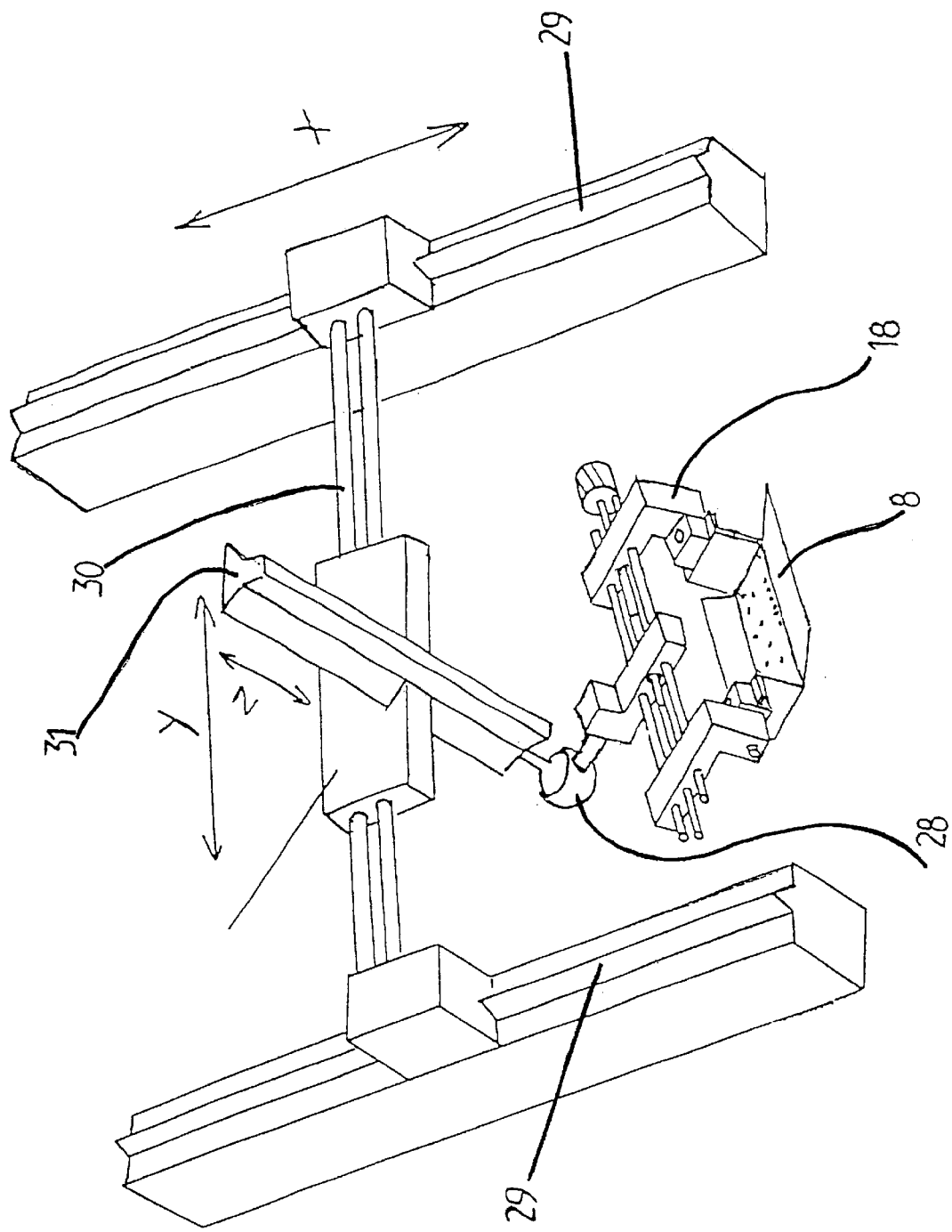
FIG. 4 shows another manner for producing a device forming a gate for operating the stencil in any area in space; the set can move in accordance with six degrees of freedom.

The substrate marked S in FIG. 3, owing to its configuration or the constituents it bears, can be stable or stabilized at three points on the support table. In the example shown, substrate S forms angle α with the table.

The configuration in all of the dimensions of the medium of the area to be screen printed may vary. This area may be bordered, for example, with height constituents such that this area is difficult to access.

Finally, the electronic board may be warped instead of flat. This sheet is flexible made of synthetic material or metal, stretched over a stretching part with means of spreading its branches.

Figure 2:
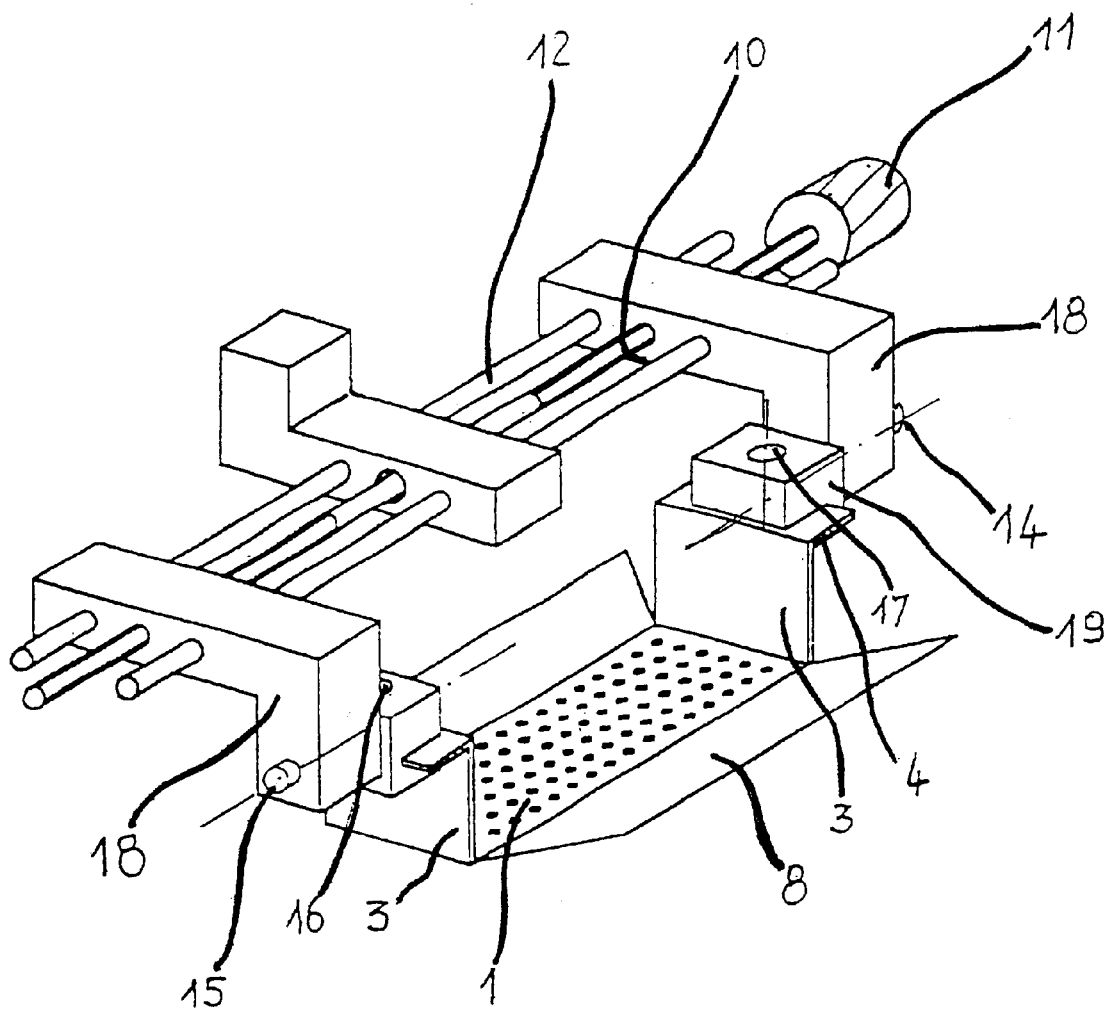
FIG. 2 shows an operational method of the tension unit for the stencil.

The tension unit shown in FIG. 2 consists of a tension axle 10 with means of tension 11 allowing for expanding or retracting support tabs 3 and placing under tension sheet 1 between them. It also includes displacement parallel rods 12 allowing to stretch the sheet when tension device 11 is acted upon.

It includes a left rotation axle 15 parallel to the sheet, and a right rotation axle 14 parallel to the sheet, and a left rotation axle 16 perpendicular to the sheet, and a right rotation axle 17 perpendicular to the sheet, these two axles being merged with the pins holding in place the tabs which lodge into the median perforation of each of their wings.

This combination of rotations allows the stencil to move independently each of its bead tabs and simultaneously around axles 16/17 perpendicular to the sheet, and axles 14/15 parallel to the sheet in function and relation with any stress perpendicular to the stencil conducted over the entire device.

FIG. 2 shows a worked form of the tension unit of sheet 1. Tension axle 10 consists of two screws with inverse pitch, commanded by a knurling tool 11, the displacement control being obtained by parallel rods 12.

Axle 10 commands the spreading of the stencil support devices 18 which bear the rotation axles parallel to the sheet, the left and right rotation axles perpendicular to the sheet consist of pins joined through split block 19 hung onto stencil support devices 18 by the rotation axles parallel to the sheet. Wings 4 and tabs 3 are locked in the slits of the block by way of pins penetrating inside their respective perforations 5. This combination of axles allows to stretch the stencil while positioning it in close contact with the electronic board, even when the latter is warped.

In accordance with the invention, the electronic board being in a given position, and regardless of that position, the tension unit and stencil 8 are moved by an operational device and are brought in and plated by the user onto the said substrate in the area where the screen printing is to be produced, and this regardless of the position of the substrate or whether the area of the substrate in question is stable.

In the instant invention, the operational device allows to move the stencil or micro-stencil within very significant ranges of movement.

In accordance with the invention, the stencil is locked into position on the electronic board to produce the screen printing; the stencil may be moved away from the substrate to drain and/or replace the latter, while being able to find again the position given by the user, and allowing to find it again by moving in the reverse direction, either of the tension unit, or the operational device bearing the tension unit and the stencil.

Beneficially, in accordance with the invention, the moving away or closing in of tension unit and stencil 8 with regard to the electronic board is done orthogonally, or close thereto, to the electronic board, thus facilitating lifting. The tension unit and stencil must be released from the substrate as stated above, by returning to the given initial position.

In accordance with the invention, locking of the support and stencil is obtained by locking the moving part in space.

FIG. 3 displays another manner for using the invention in which is shown the tension unit on the table, as described, and stencil 8. The tension unit is attached by way of a joint to the extremity of the moving part, thus able to move in space by means of arm 20 with several rods 20A, 20B, 20C, 20D, etc., joined to each other; the said arm being attached at its other extremity to vertical displacement mobile plunger 25.

In accordance with a preferred manner for using the invention, arm 20 is a locking arm by means of known hydraulics of its joints 21A, 21B, the locking being obtained by a sole locking 22. Finally, spherical joint 21C alone confers to rod 20A bearing the tension unit the possibility of making a very fine adjustment of the stencil onto the electronic board. An arm with several rods with a sole mechanical locking can also be used. Plunger 25 onto which is affixed arm 20 at one point, is mounted onto casing 23 allowing it to move in the Z manner by way of lever 24; this layout allows to move the bench mark and lift stencil 8 with regard to the substrate placed on table 28 by way of an orthogonal or close to orthogonal movement.

Beneficially, in the example for executing the invention, is shown scraper or grater 26, acting on the stencil, which may be controlled by any known part 27. Arm 20 is movable in space around its fastening to the plunger, and its jointed system allows to position the stencil in any position in accordance with the six degrees of freedom of the arm.

In accordance with another non-illustrated manner for executing the invention, the arm is mounted onto a part fastened to the table and not movable, or onto the table itself, and a plunger system like plunger 25, moving in a Z fashion, and attached to the other extremity of the moving arm, bearing tension unit and stencil 8 to allow it to move away orthogonally from the electronic board, regardless of the position of the substrate.

In this case the movement of the stencil is obtained without a displacement of the mobile arm which retains the position conferred to it by the user, by positioning stencil 8 on the substrate and locking the mobile arm. In these two cases the mobile part, i.e. jointed arm 20, keeps its position and finds the original position by way of displacement via plunger 25.

FIG. 4 illustrates another manner for executing the invention, showing the tension unit, as described, and stencil 8.

The tension unit is attached by way of a joint to the extremity of an operational device which can move in space in accordance with six degrees of freedom. The operational device ends in a gooseneck 28 which provides the possibility of moving the tension unit, and thus, the stencil in accordance with three possible rotations in space. The three displacements in space, in accordance with X, Y and Z, are made possible via sliding rails 29, 30 and 31, respectively. It is understood that the 6 possible movements in space can be locked, such that the position of the tension unit can be locked.

In accordance with another characteristic of the invention, sliding rail 31 of the gate, may be moved in a Z fashion, independently of the other degrees of freedom, while maintaining the other movements locked to allow the stencil to move away from the substrate and keep the rest of the configuration locked.

Displacement in accordance with six degrees of freedom of the tension unit and the stencil can be manual, motorized or automated. One or several parts of currently available locking means of any kind allow to lock the stencil in position when the stencil is in a proper position on the substrate area to be screen printed. The distancing of the stencil from the substrate, in a Z fashion, allows to lift and remove the substrate to replace it with another.

What is claimed is:

1. A stencil and device for depositing, by a printing operation, a product on an electronic board, comprising:
   a stencil comprising:
      a flat sheet (1), of rectangular shape, made of flexible material, the flat sheet having transfer openings (2) for distributing the product at a constant amount;
      first and second tabs (3), each of the tabs being rigid and individually affixed to parallel sides of the sheet, the tabs being opposite one another relative to the sheet; and
      first and second flaps (6) individually extending from the remaining parallel sides of the sheet opposite one another relative to the sheet, the first and second flaps being separated from the sheet by first and second folds (7), respectively, wherein said folds delimit the sides of the sheet, the flaps being free to rotate around the fold, limited in motion by the sheet,
   a tension unit constructed and arranged to stretch and conform said stencil to said electronic board, wherein the first and second tabs (3) are attached to said tension unit; and
   an operational device to operate the stencil and the tension unit in space, in accordance with six degrees of freedom.

2. Stencil and device in accordance with claim 1, the sheet and the tabs forming a partially enclosed space having a bottom, top and sides, wherein the sheet, supplied with said transfer openings (2), form the bottom of the space, the space being opened toward, and accessible at the top.

3. Stencil and device in accordance with claim 2, the partially enclosed space having four sides, wherein the partially enclosed space is accessible through at least two of the four sides.

4. Stencil and device in accordance with claim 1, wherein the flaps (6) are free as opposed to the tabs, relative to the sheet.

5. Stencil and device in accordance with claim 1, further comprising a scraper having a length, the length of the scraper corresponding to that of the sheet.

6. Stencil and device in accordance with claim 1, said stencil having on each of the first and second tabs (3) a wing (4) parallel to the sheet, characterized by the fact that the stencil is affixed by the said wings onto the said tension unit, the tension unit comprising:
   stencil support devices;
   a tension axle (10) parallel to the sheet and associated with the stencil support devices;
   displacement parallel rods (12) supporting the stencil support devices;
   first rotation axles (14/15) of each tab parallel to the sheet; and
   second rotation axles (16/17) of each tab perpendicular to the sheet;
the operational device comprising an arm (20) having a plurality of jointed rods, a locking means (22) for locking the arm in place, and an arm support, said arm bearing a part on which the sheet is stretched at one end, the other end being attached on the arm support (25), which moves vertically, the stencil thus being able to move in accordance with six degrees of freedom.

7. Stencil and device in accordance with claim 6, wherein the arm support allows the stencil to move away from the electronic board while maintaining the configuration in which the stencil is locked.

8. Stencil and device in accordance with claim 7, wherein the operational device further comprises rotation axles (21) and a sole locking (22), wherein the plurality of jointed rods of the arm of the operational device are around rotation axles, lockable in a work position by means of said sole locking (22).

9. Stencil and device in accordance with claim 1, said stencil having on each of the first and second tabs (3) a wing (4) parallel to the sheet, wherein the stencil is affixed by the said wings onto the tension unit, the operational device forming a gate comprising three sliding rails (29), (30) and (31), and a gooseneck (28) connection, wherein said stencil can be moved in accordance with six degrees of freedom.

10. Stencil and device in accordance with claim 9, wherein a portion of the gate may be moved along one of said slide rails (31), while keeping the other movements of the gate locked to allow the stencil to move away from the electronic board, while maintaining the positioning of the rest of the gate.

11. Stencil and device in accordance with claim 10, further comprising a scraper having a length, the length of the scraper corresponding to that of the sheet.

12. Stencil and device in accordance with claim 1, wherein the flat sheet (1) is made of semi-transparent synthetic material facilitating positioning of the stencil.

13. Stencil and device in accordance with claim 1, wherein the flat sheet is made of a synthetic material.

14. Stencil and device in accordance with claim 1, wherein the flat sheet is made of metal.

15. Stencil and device in accordance with claim 1, wherein the tension unit is centered over the flat sheet.

* * * * *